United States Patent
Zuniga et al.

(10) Patent No.: US 9,844,800 B2
(45) Date of Patent: Dec. 19, 2017

(54) SYSTEMS, METHODS AND APPARATUS FOR POST-CHEMICAL MECHANICAL PLANARIZATION SUBSTRATE CLEANING

(71) Applicant: Applied Materials, Inc., Santa Clara, CA (US)

(72) Inventors: Steven M. Zuniga, Soquel, CA (US); Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 770 days.

(21) Appl. No.: 14/260,210

(22) Filed: Apr. 23, 2014

(65) Prior Publication Data

US 2015/0306637 A1     Oct. 29, 2015

(51) Int. Cl.
  *B08B 1/00*   (2006.01)
  *B08B 1/04*   (2006.01)
  *H01L 21/67*  (2006.01)
  *B24B 37/34*  (2012.01)

(52) U.S. Cl.
  CPC ............... *B08B 1/04* (2013.01); *B08B 1/001* (2013.01); *B24B 37/34* (2013.01); *H01L 21/67046* (2013.01)

(58) Field of Classification Search
  CPC ..... B08B 1/04; B08B 1/001; H01L 21/67046; B24B 37/34
  See application file for complete search history.

(56) References Cited

U.S. PATENT DOCUMENTS

| | | | |
|---|---|---|---|
| 2002/0005212 A1* | 1/2002 | Beardsley | H01L 21/67046 134/6 |
| 2002/0130034 A1 | 9/2002 | Uzoh et al. | |
| 2004/0033696 A1 | 2/2004 | Hu et al. | |
| 2005/0167048 A1* | 8/2005 | Polyak | B24B 53/017 156/345.12 |
| 2007/0039927 A1 | 2/2007 | Withers et al. | |
| 2009/0305613 A1* | 12/2009 | Choi | B24B 37/30 451/36 |
| 2015/0114430 A1* | 4/2015 | Sakata | B08B 1/006 134/6 |

OTHER PUBLICATIONS

International Preliminary report on Patentability of International Application No. PCT/US2015/026552 dated Nov. 3, 2016.
International search report & Written Opinion of International Application No. PCT/US2015/026552 dated Jul. 28, 2015.
Ko et al., of U.S. Appl. No. 14/167,818, titled: "Methods and Apparatus for Post-Chemical Mechanical Planarization Substrate Cleaning," filed Jan. 29, 2014.

* cited by examiner

*Primary Examiner* — Alexander Markoff
(74) *Attorney, Agent, or Firm* — Dugan and Dugan, PC

(57) ABSTRACT

Embodiments of the invention include systems, methods and apparatus for pre-cleaning a substrate after chemical mechanical planarization processing. Embodiments provide a housing; a chuck assembly configured to securely hold a substrate within the housing; and a buffing pad assembly configured to rotate against the substrate while supported within the housing. The buffing pad assembly includes a buff pad, a compressible sub-pad coupled to the buff pad, and a pad holder coupled to the compressible sub-pad and a buffing motor configured to rotate the buffing pad assembly. Numerous additional aspects are disclosed.

20 Claims, 5 Drawing Sheets

SYSTEMS, METHODS AND APPARATUS FOR POST-CHEMICAL MECHANICAL PLANARIZATION SUBSTRATE CLEANING

FIELD

Embodiments of the invention relate generally to electronic device manufacturing including chemical mechanical planarization (CMP), and more particularly to methods and apparatus for substrate buff pre-cleaning after CMP.

BACKGROUND

After a chemical mechanical polish or planarization (CMP) process, substrates typically are cleaned to remove debris and particles applied or generated during the CMP process that can cling to the substrate including the edge bevel of the substrate. Following CMP, substrates are typically rinsed and transferred to a cleaning module such as a scrubber brush box, a megasonic tank, or the like. However, some particles and residues that remain following CMP may be difficult to remove using conventional cleaning methods such as brush box scrubbing or megasonic tank immersion. Therefore, methods and apparatus are desired for the improved removal of particles during a post-CMP cleaning process without scratching the substrates.

SUMMARY

In some aspects of embodiments of the invention, a post-CMP substrate pre-clean system is provided. The substrate pre-clean system includes a housing; a chuck assembly configured to securely hold a substrate within the housing; and a buffing pad assembly configured to rotate against the substrate while supported within the housing. The buffing pad assembly includes a buff pad, a compressible sub-pad coupled to the buff pad, and a pad holder coupled to the compressible sub-pad. A buffing motor configured to rotate the buffing pad assembly is also provided.

In other aspects, a post-CMP substrate pre-clean buffing pad assembly is provided. The post-CMP substrate pre-clean buffing pad assembly includes a buff pad, a compressible sub-pad coupled to the buff pad, and a pad holder coupled to the compressible sub-pad. A buffing motor configured to rotate the buffing pad assembly is also provided.

In yet other aspects, a method of pre-cleaning substrates after CMP in a post-CMP substrate pre-clean module is provided. The method includes loading a substrate into a pre-clean system after chemical mechanical planarization processing; securing the substrate to a chuck assembly; rotating the substrate as a rotating buffing pad assembly is pressed against, rotated, and swept across the front side of the substrate; and maintaining a buff pad of the buffing pad assembly flat against the substrate despite tilting of a pad holder of the buffing pad assembly.

Other features and aspects of embodiments of the invention will become more fully apparent from the following detailed description of example embodiments, the appended claims, and the accompanying drawings.

BRIEF DESCRIPTION OF THE DRAWINGS

Various embodiments of the invention are disclosed in the following detailed description and accompanying drawings.

DETAILED DESCRIPTION

Figure 1:
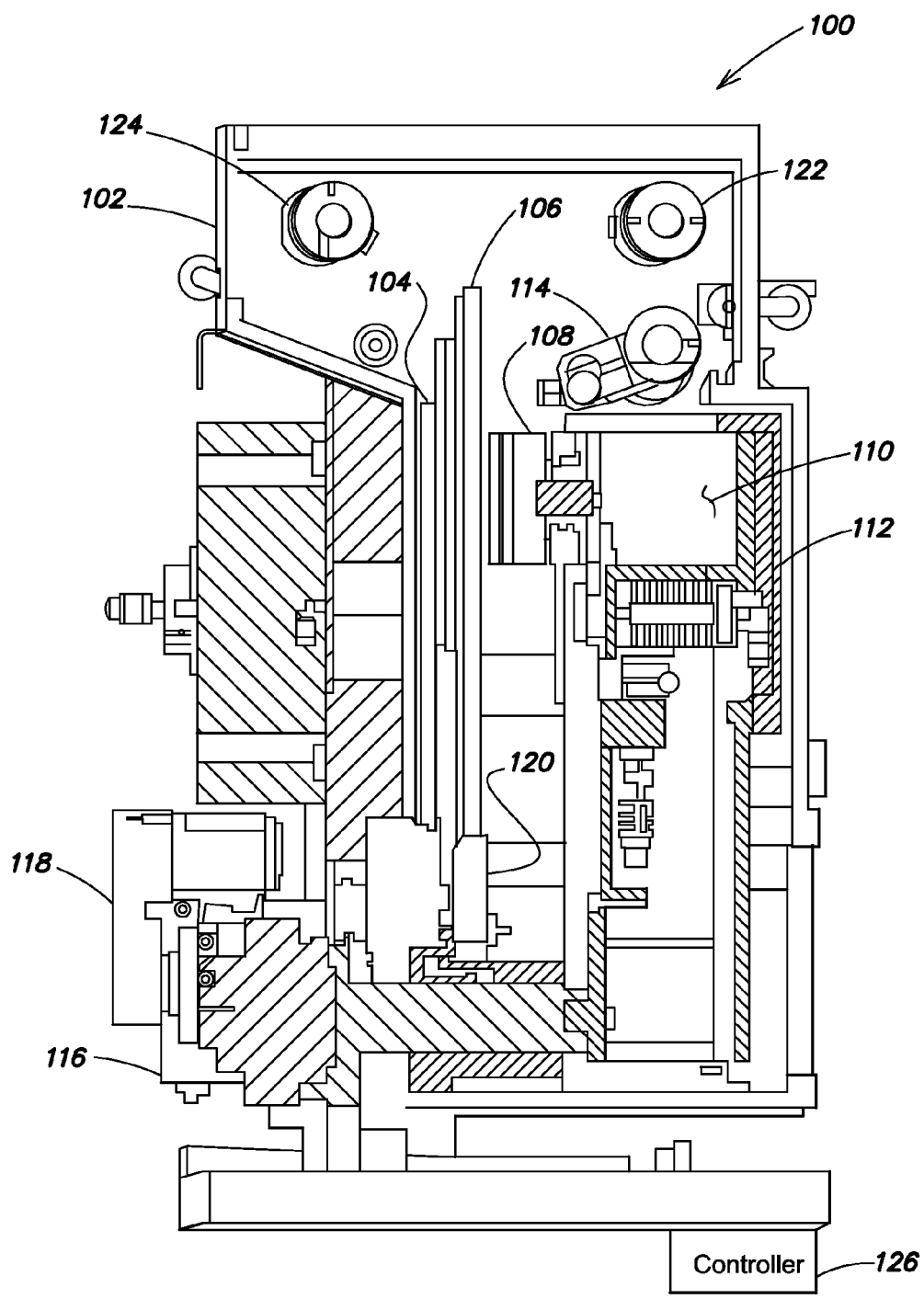
FIG. 1 is a cross-sectional side-view schematic diagram illustrating an example substrate pre-clean system according to embodiments of the present invention.

The following is a detailed description of example embodiments to illustrate the principles of the invention. The embodiments are provided to illustrate aspects of the invention, but the invention is not limited to any embodiment. The scope of the invention encompasses numerous alternatives, modifications and equivalents. Numerous specific details are set forth in the following description in order to provide a thorough understanding of the invention. However, the invention may be practiced according to the claims without some or all of these specific details. For the purpose of clarity, technical material that is known in the technical fields related to the invention has not been described in detail so that the embodiments of the invention are not unnecessarily obscured.

As used herein unless otherwise specified, the term "polish" is intended to mean the removal of material from a substrate that results in planarizing and/or thinning of the substrate. Polishing may be performed during a CMP process using a polish pad to planarize and/or thin a substrate down to an endpoint (e.g., a surface smoothness).

As used herein unless otherwise specified, the term "buff" is intended to mean the removal of residue and/or particles that have inadvertently become adhered to a substrate. Buffing may be performed during a post-CMP "pre-clean" process using a buff pad. The pre-clean process may be performed until a lower and/or desired threshold level of surface particles has been reached. Compared to polishing, buffing is a less aggressive process using a softer buff pad not intended to thin and/or planarize a substrate but rather to merely remove debris and/or residue that has adhered to or otherwise become attached to the substrate. For example, buffing may be performed with a sponge-like material such as polyvinyl acetate (PVA), or another similar and/or suitable material.

As used herein unless otherwise specified, the term "scrub" is intended to mean the removal of residue and/or particles that have merely accumulated on a substrate but do not require substantial force to remove. Scrubbing may be performed during a cleaning process (typically after a pre-cleaning process). Compared to buffing, scrubbing is a less aggressive process using a softer brush (e.g., in a scrubber brush box) not intended to apply significant pressure to the substrate (in comparison to buffing).

As described above, following CMP, substrates are typically rinsed and transferred directly to a cleaning module such as a scrubber brush box, a megasonic tank, or the like. However, some adhered particles and/or residues that remain following CMP may be difficult to remove within a conventional brush box or megasonic tank. Thus, embodiments of the present invention provide buffing pre-clean systems, apparatus and processes that "pre-clean" substrates after CMP, but prior to (and/or in place of) conventional scrubbing substrate cleaning.

Compared to conventional cleaning processes, the pre-clean process may employ a harder buff pad and/or a chemically assisted cleaning process to clean difficult to remove particles and/or residues from a substrate prior to conventional substrate cleaning. For example, the pre-clean process can employ direct front side buffing of a substrate surface with a polyurethane, silicone, polyvinyl acetate or similar buff pad or brush with a suitable cleaning chemistry (e.g., slurry, an $H_2O_2$ solution, etc.). Embodiments of the present invention employ an improved self-leveling buffing pad assembly that includes a sub-pad which serves to maintain the contact surface of a buff pad substantially parallel to the surface of the substrate being pre-cleaned. The sub-pad is adapted to compress and/or absorb any angular moments exerted on the buffing pad assembly due to lateral motion and friction or correct for any non-parallelism between the buff pad and the substrate. By absorbing the angular moments or misalignment, the sub-pad allows the buff pad to remain flat or flush against the substrate even as the substrate and the buff pad move relative to each other.

More generally, embodiments of the present invention provide a compact arrangement to pre-clean substrates after CMP by using a chuck (e.g., a vacuum chuck) to support a substrate so that the front side is accessible for direct buffing using a relatively small buffing pad assembly (e.g., a stacked buff pad and sub-pad having a contact area with a diameter smaller than the diameter of the substrate, for example, a buffing pad assembly with a diameter that is less than half the diameter of the substrate) applied to a specific area of the front side of the substrate. Thus, because a small buffing pad assembly is used, direct front side metrology can be used concurrently during cleaning without having to image through a window, buff pad or the like. Chemistry, such as slurry, may be dispensed directly on the front side of the substrate, easing dispensing distribution as well as chemical consumption. In some embodiments, chemistry, such as slurry, may be delivered directly to the substrate by an embedded spray dispenser mounted on a swing arm supporting the buffing pad assembly. This can reduce chemistry consumption by improving and/or optimizing control of the dispensing. In one or more embodiments, cleaning chemistry, such as slurry, may be delivered directly through the buffing pad assembly.

Embodiments of the system enable cleaning of a substrate by applying different loads on and/or rotation rates to the buffing pad assembly. The pre-cleaning profile is controllable by the buffing pad assembly position and buffing pad assembly sweeping profile (e.g., including sweep range, frequency, shape, time for each sweeping zone, etc.). Various embodiments can target specific regions of the substrate, so that the system can be used to improve the edge defectivity of the substrate (e.g., reduce defect levels near the edge of the substrate), which is difficult to achieve using conventional cleaning methods. In addition, embodiments of the present invention can provide a buff pre-cleaning function similar to processes developed using conventional CMP methods for the purpose of replacing, or re-configuring, an additional platen in the CMP system.

In some embodiments, the buffing pad assembly can be supported using a swing arm. Chemistry, such as slurry, can be applied to the substrate through the buffing pad assembly. Alternatively, a buffing pad assembly can be used and chemistry can be applied to a substrate through a spray nozzle embedded in and/or coupled to the swing arm body. In some embodiments, a nylon bristle brush can be used with the chemistry applied through the center of the brush for in-situ or ex-situ conditioning of the buffing pad assembly.

In other embodiments, a diamond dressing disk can be used for in-situ or ex-situ conditioning the buffing pad assembly. In some embodiments, a surface hatch for changing the buffing pad assembly (and/or for changing the nylon bristle brush or diamond disk used for buffing pad assembly conditioning) can be included in the housing of the pre-clean module. During buffing, the distance between the buffing pad assembly and the substrate and/or the pressure of the buffing pad assembly on the substrate can be controlled.

In some embodiments, the buffing pad assembly can include a relatively soft buff pad (though which is harder than a typical PVA brush) to clean off difficult to remove particles. Embodiments of the present invention provide the ability to apply a chemical buff process to the front side of a substrate, for example, after conventional CMP is performed. Thus, embodiments of the present invention can be used to prepare the front side surface of a substrate after a CMP process for a cleaning process (e.g., using a conventional brush box or megasonic cleaner).

Turning now to FIG. 1, a side cross-sectional view of an example embodiment of a post-CMP pre-clean system 100 is depicted. The particular example pre-clean system 100 includes a housing 102 that encloses a chuck assembly 104 (e.g., a vacuum chuck assembly) for holding a substrate (not shown) to be pre-cleaned. The chuck assembly 104 includes a platen 106 (e.g., a vertical platen) against which the back side of the substrate is held flat for support during the pre-clean process. In some embodiments, a soft and/or tacky film is used to chuck the substrate to the platen without adding damage to the substrate backside. In some embodiments, the platen 106 can be adapted to rotate while supporting the substrate.

The front side of the substrate is contacted by the buffing pad assembly 108 which is driven to rotate by the buffing motor 110 which is supported by the swing arm assembly 112. In some embodiments, the swing arm assembly 112 can also support a chemical spray assembly 114, for example, aimed at the substrate just above the contact area of the buffing pad assembly 108. Alternatively, the chemical spray assembly 114 can be supported by the housing 102. In some embodiments, the buffing pad assembly 108 can include one or more channels to deliver the cleaning chemistry to the substrate surface though the buffing pad assembly 108.

While cleaning chemistry is applied to the substrate, the swing arm assembly 112 is adapted to sweep or oscillate the rotating buffing pad assembly 108 across the front side surface of the substrate to affect the pre-cleaning of the substrate. The swing arm assembly 112 is oscillated by the drive assembly 116 (e.g., a gear drive assembly). The drive assembly 116 can also be adapted to move the swing arm assembly 112 and consequently the buffing pad assembly 108, both away from and toward the substrate held by the chuck assembly 104. In some embodiments, instead of a swing arm, a linear gantry can be used to support and move the buffing pad assembly 108, the buffing motor 110, and optionally, the chemical spray assembly 114.

A substrate lift assembly 118 including a substrate support 120 can be used to hold and position the substrate on the platen 106 of the chuck assembly 104 until the substrate has been secured to the platen 106, e.g., via vacuum pressure applied by the chuck assembly 104. In some embodiments, the post-CMP pre-clean system 100 can include a front side spray bar assembly 122 and a back side spray bar assembly 124, both mounted in the upper portion of the housing 102 and positioned to allow application of a rinse (e.g., deionized (DI) water) as a substrate, e.g., rotating on the chuck, is lowered into and/or lifted out of the system 100.

The post-CMP pre-clean system 100 also includes a controller 126 operable to activate, monitor, and control the various assemblies of the system 100. In some embodiments, the controller 126 includes a processor and a memory operative to store instructions (e.g., a software program) executable by the processor. The processor can include an input/output (I/O) interface adapted to send control signaling to the various assemblies of the system (e.g., the chuck assembly 104, the buffing pad assembly 108, the buffing motor 110, the swing arm assembly 112, the chemical spray assembly 114, drive assembly 116, the substrate lift assembly 118, the spray bar assemblies 122, 124, etc.) as well as status signaling to external systems monitoring and controlling the system 100. Likewise, the I/O interface can be further adapted to receive control signaling from external systems and status signaling from sensors (e.g., pressure feedback transducers, rotation speed sensors, metrology sensors, etc.) or other components of the various assemblies of the system 100. Communication between the I/O interface, the external systems, and the various assemblies of the system 100 can be via wiring (not shown) or via wireless signaling.

Figure 2:
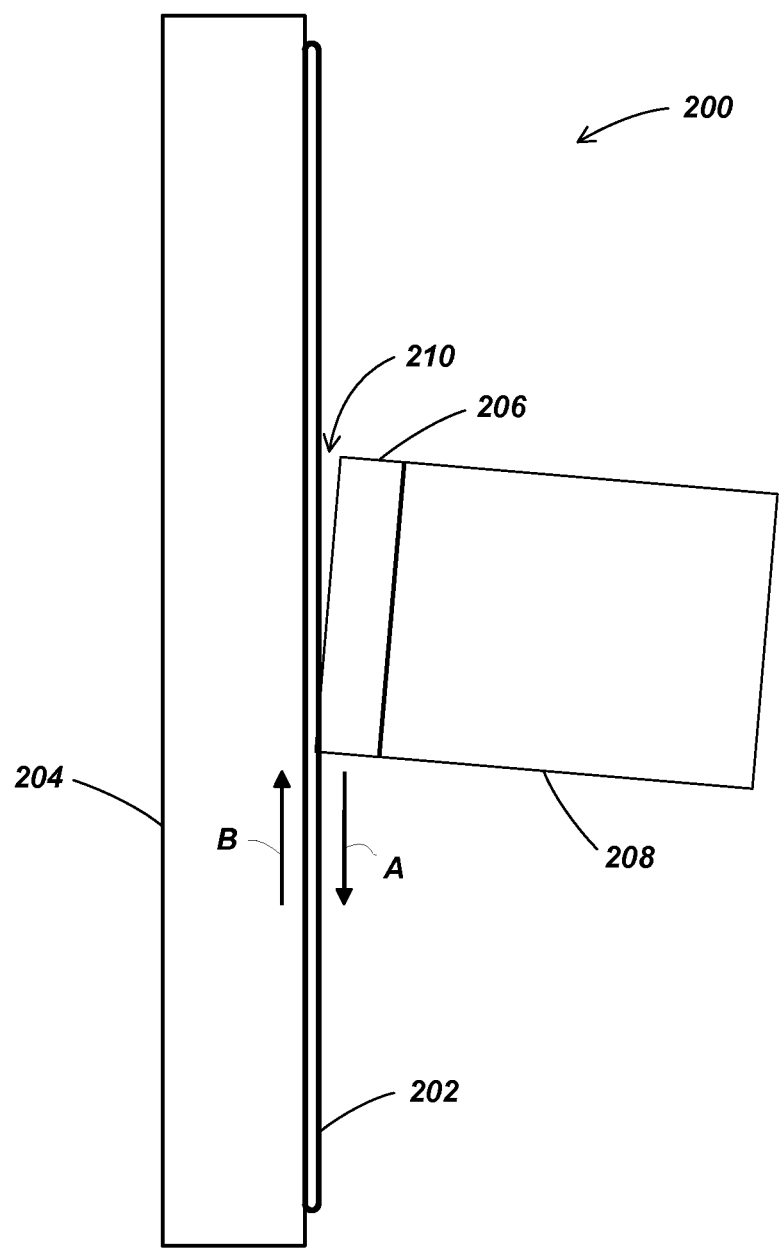
FIG. 2 is a schematic diagram illustrating an example substrate pre-clean pad in use without a compressible sub-pad.

Turning now to FIG. 2, a top edge view 200 of a substrate 202 supported by a platen 204 being cleaned using a pad 206 and a pad holder 208 without a sub-pad as provided herein (described below) is depicted. With pressure being applied via the pad 206 and pad holder 208 as the pad 206 is pushed across the surface of the substrate 202 in the direction indicated by arrow A, friction creates an equal and opposite shear force between the pad 206 and the substrate 202 in the direction indicated by arrow B. The shear force leads to an angular moment on the pad 206 and pad holder 208 and tilting of the pad holder 208 of approximately 0.1 degrees to approximately 1 degree can occur. Alternately, the pad and pad holder can become tilted relative to the substrate due to machining and/or assembly tolerances of similar magnitude. Either of these factors can result in an angled gap 210 and only partial contact of the pad 206 against the substrate 202. Such an angled gap 210 means longer process times and local high pressure areas during buffing. This high pressure can lead to scratching on metal surfaces and uneven buffing pad wear. The relatively high aspect ratio and small size of the buffing pad 206 and pad holder 208 make design of a gimbal to support the pad holder 208 with a rotation point near the substrate surface difficult.

Figure 3:
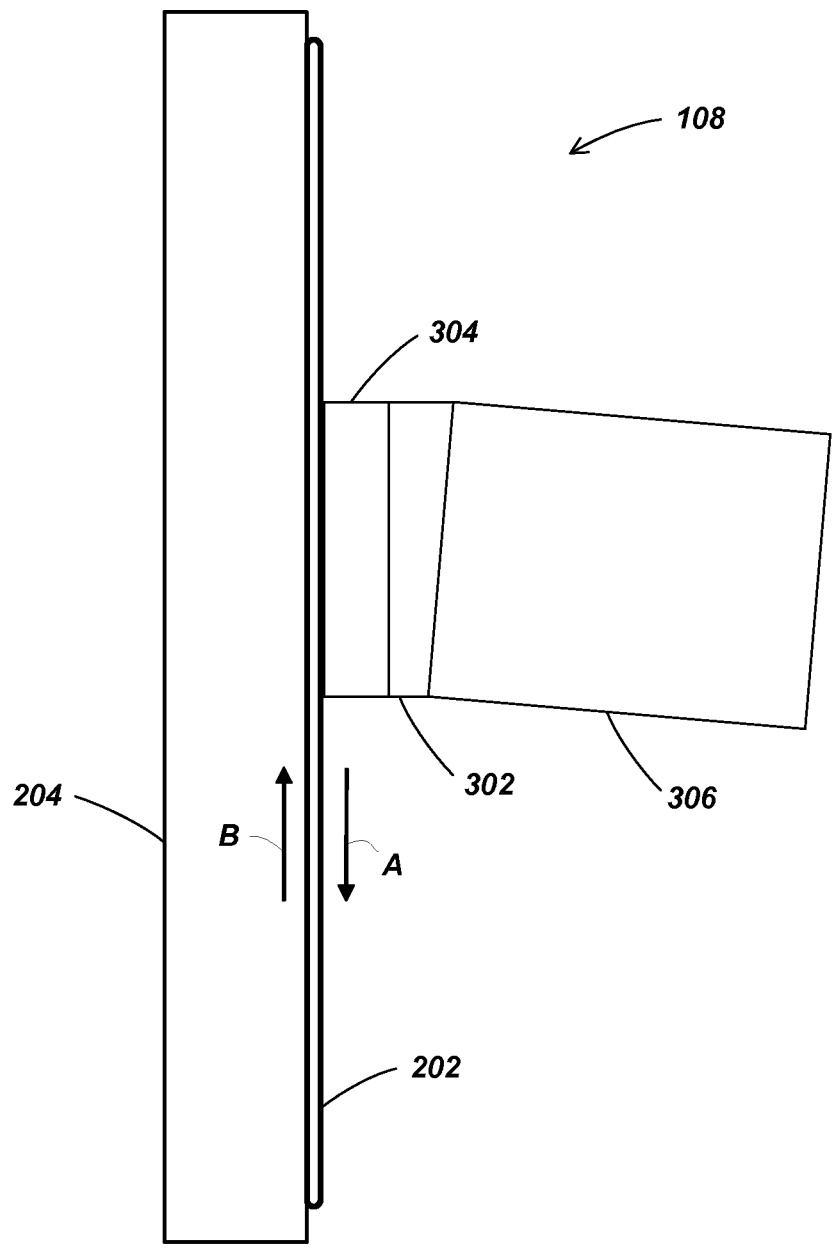
FIG. 3 is a schematic diagram illustrating an example substrate pre-clean buff pad in use with a compressible sub-pad according to embodiments of the present invention.

Turning to FIG. 3, the buffing pad assembly 108 of embodiments of the present invention solves the problems described above using a sub-pad 302, a buffing pad 304, and a pad holder 306 in a post-CMP pre-clean module 100. By adding a relatively compressible sub-pad 302 between the buff pad 304 and the pad holder 306, the buff pad 304 maintains full contact with the substrate 202.

More specifically, the relatively soft sub-pad 302 will yield when an angular moment is generated by shear force between the buff pad 304 and the substrate 202 so that the buff pad 304 remains in contact with the substrate 202, distributing the load when the pad holder 306 tilts. This leads to a more uniform pressure under a fixed load, a larger contact area, and more uniform pad wear.

Further, the more uniform pressure helps to prevent scratching, extends the buff pad 304 life, and improves particle removal efficiency. When the pad holder 306 tilts without a sub-pad 302, the contact area of the buff pad 304 decreases. Thus, for a given applied force, the buff pad pressure at the smaller contact area increases. Thus, in order to stay above the scratch pressure threshold, the applied force should be reduced. However, the amount of applied force to both avoid the scratch pressure threshold and to effectively remove particles can be below the practical capabilities of the buffing system.

The buff pad's life is determined by the thinnest part of buff pad 304. If the buff pad 304 does not maintain uniform contact with the substrate 202 when the pad holder 306 tilts, the outer edge of the buff pad 304 wears faster than the rest of the buff pad 304 and thus, the buff pad's life is consumed more rapidly even though the center portion of the buff pad 304 is barely used. By using a relatively compressible sub-pad 302 disposed between the buff pad 304 and the pad holder 306 according to embodiments of the present invention, more even pressure distribution results, more even wear is experienced, and therefore, longer buff pad life is achieved.

Improved particle removal efficiency is also gained by using a relatively compressible sub-pad 302 between the buff pad 304 and the pad holder 306 according to embodiments of the present invention. With a larger effective buff pad contact area on the substrate, substrate coverage is improved. Thus, the time to clean the entire substrate is reduced which results in improved processing efficiency.

Figure 4:
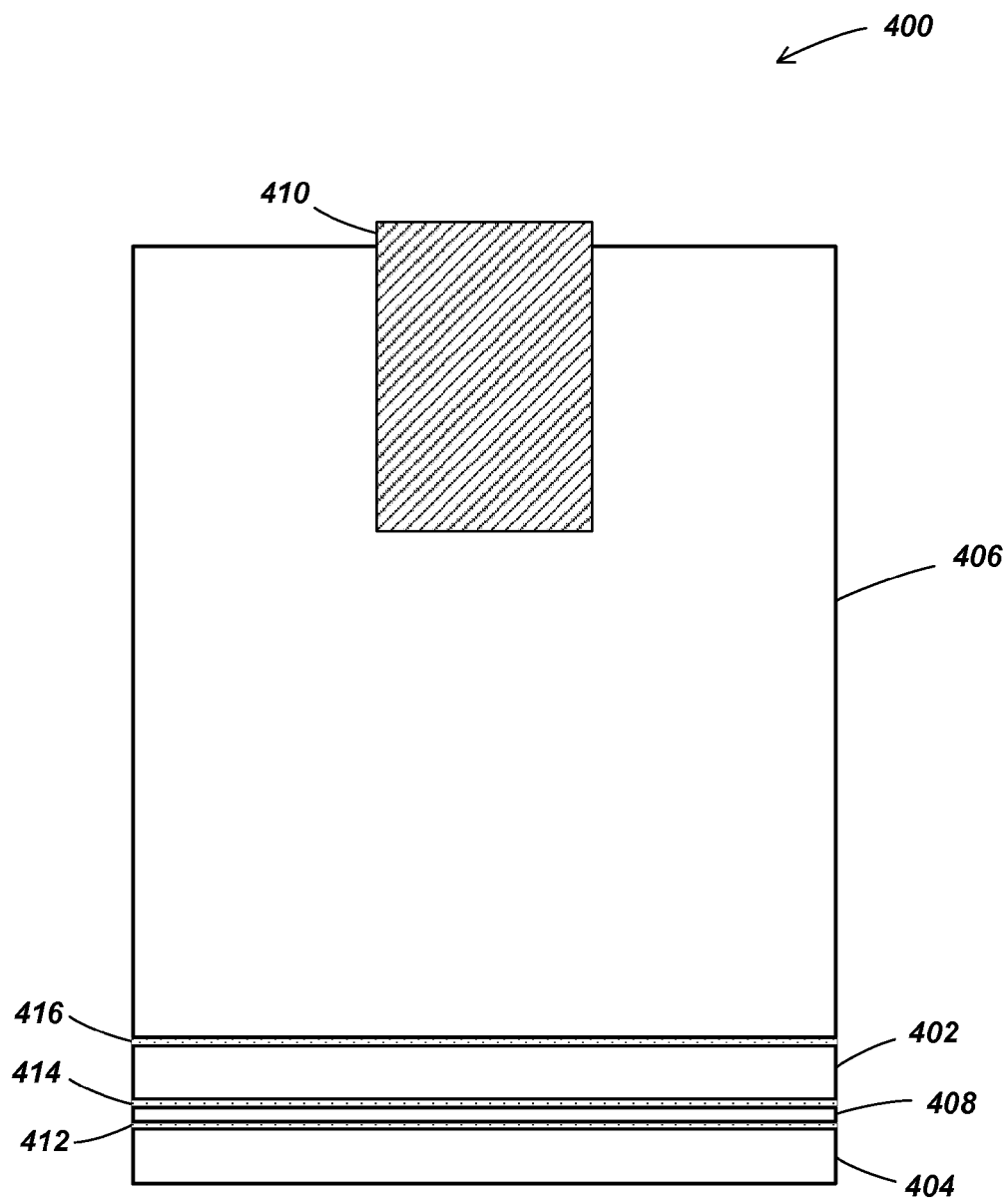
FIG. 4 is a schematic diagram illustrating details of an example substrate pre-clean buffing pad assembly according to embodiments of the present invention.

FIG. 4 is a magnified schematic cross-sectional side view, rotated 90 degrees counter-clockwise relative to the prior views and depicting details of an example of a buffing pad assembly 400 according to embodiments of the present invention. As with other drawings herein, FIG. 4 is not drawn to scale so that features of embodiments of the invention can be more clearly represented. The particular example buffing pad assembly 400 shown in FIG. 4 is generally cylindrical in overall shape with an overall profile height of 0.5 mm to approximately 5 mm and a diameter of approximately 25 mm to approximately 150 mm. Other shapes and dimensions are possible. The depicted example includes a compressible sub-pad 402 disposed between a buff pad 404 and a pad holder 406.

In addition, the pictured embodiment includes an optional stiffener layer 408 disposed between the compressible sub-pad 402 and the buff pad 404. In some embodiments, a stiffener layer 408 provides improved bonding between the buff pad 404 and the sub-pad 402. In other words, the stiffener layer 408 provides a more stable and rigid base to bond the softer buff pad 404 and the sub-pad 402 to ensure a reliable bond that will endure the shear forces applied during use. In some embodiments, the stiffener layer 408 can be approximately less than 0.5 mm. Other thicknesses can be used. The stiffener layer 408 can be formed from polyethylene terephthalate (PET) or other relatively stiff polymer such as polyethylene or polypropylene.

The pad holder 406 is coupled to the buffing motor 410. Adhesive (e.g., pressure sensitive adhesive (PSA)), thermal bonding, or mechanical fasteners can be used to secure the pad holder 406 to the buffing motor 410. Likewise, adhesive 412, 414, 416 (e.g., PSA), thermal bonding, or mechanical fasteners can be used to secure the buff pad 404 to the stiffener layer 408, the stiffener layer 408 to the compressible sub-pad 402, and the compressible sub-pad 402 to the pad holder 406. In some embodiments, the stiffener layer 408 can be integrally formed with the buff pad 404 and/or the compressible sub-pad 402. Likewise, the compressible sub-pad 402 can be integrally formed with the buff pad 404 in embodiments where the optional stiffener layer 408 is not used. In other embodiments, the compressible sub-pad 402 can be integrally formed with both the buff pad 404 and the stiffener layer 408.

In some embodiments, the buff pad 404 can be approximately 0.5 mm to approximately 2 mm thick. Other thicknesses can be used. The buff pad 404 can have a flat or textured contact surface where the texture can be grooved, embossed, or otherwise textured. The volume porosity of the buff pad 404 can be approximately 10% to approximately 40%. Pads with other volume porosities can be used. In some embodiments, the buff pad 404 can have a Shore D hardness number from approximately 10 to approximately 40, and in other embodiments, a Shore A hardness number from approximately 5 to approximately 30. Pads with other hardnesses can be used. In some embodiments, conventional polish pads can be used as buff pads.

The compressible sub-pad 402 can be approximately 0.5 mm to approximately 2 mm thick. Other thicknesses can be used. The sub-pad 402 can have a compressive modulus of elasticity of approximately 1 psi to approximately 20 psi. Pads with other compressive moduli can be used. In some embodiments, the compressible sub-pad 402 can be dimensioned and compressible enough to accommodate up to approximately 1 degree of pad holder tilt angle. In other embodiments, larger tilt angles can be accommodated.

To insure that the buff pad 404 remains flat on the substrate during tilting of the pad holder 406, the compressive sub-pad 402 and the buff pad 404 can be selected so that the compressible sub-pad 402 is greater than two times more compressible than the buff pad 404. Thus, the buff pad 404 can have compressive modulus of elasticity of approximately more than 2 psi to approximately more than 40 psi when the sub-pad 402 has a compressive modulus of elasticity of approximately 1 psi to approximately 20 psi. The sub-pad 402 of embodiments of the present invention is softer than polish pads used in pad stacks.

Figure 5:
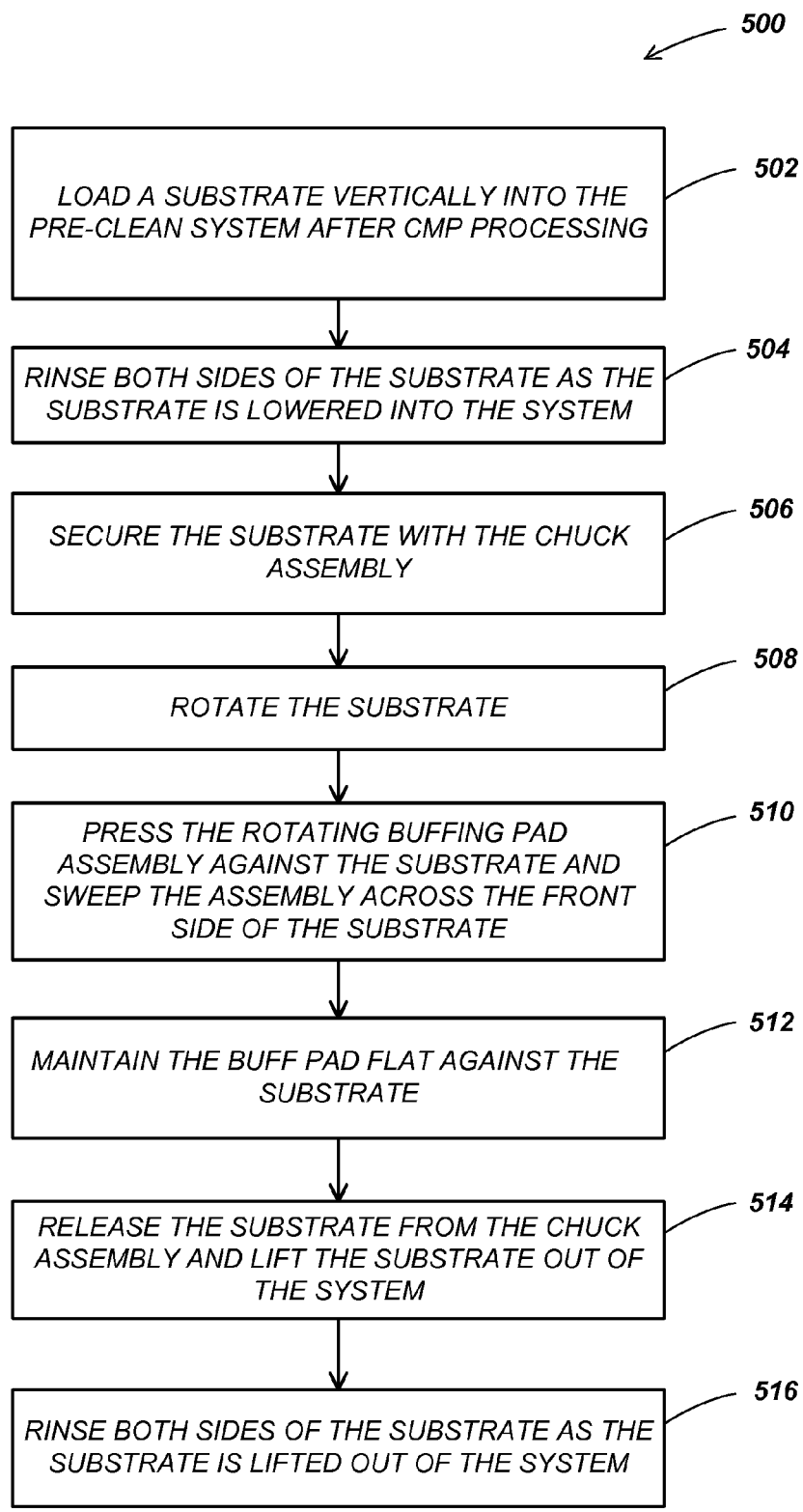
FIG. 5 is a flowchart depicting an example method according to embodiments of the present invention.

Turning now to FIG. 5, an example method 500 of embodiments of the present invention is presented in the form of a flow chart. In operation, a substrate 202 is loaded vertically into the pre-clean system 100 after being processed in a CMP module (502). In some alternative embodiments, the pre-clean system can be configured so that the substrate is loaded and pre-cleaned in a horizontal orientation. As the substrate 202 is lowered to the substrate support 120, both sides of the substrate 202 can be optionally and concurrently sprayed with DI water or other rinse solution via the spray bar assemblies 122, 124 (504). The substrate 202 is then secured to the platen 106 by the chuck assembly 104 (506). In some embodiments, the substrate 202 is rotated (508) as the rotating buffing pad assembly 108 is pressed against, rotated, and swept across the front side of the substrate (510). As the buffing pad assembly 108 sweeps against the substrate 202, an angular moment is created that tilts the pad holder 306 (FIG. 3) of the buffing pad assembly 108 and the compressible sub-pad 302 yields to maintain the buff pad 304 flat against the substrate 202 (512). Once the end of the pre-clean process is reached, the buffing pad assembly 108 is removed from the substrate 202, the substrate 202 is released from the chuck assembly 104, and the substrate 202 is lifted out of the pre-clean system (514). As the substrate 202 is lifted out of the system 100, both sides of the substrate 202 can be optionally and concurrently sprayed with DI water or other rinse solution via the spray bar assemblies 122, 124 (516).

It will be readily apparent that the various methods described herein may be implemented by or under the control of, e.g., an appropriately programmed general purpose computer or other computing device. Typically a processor (e.g., one or more microprocessors) will receive instructions from a memory or like device, and execute those instructions, thereby performing one or more processes defined by those instructions. Further, programs that implement such methods may be stored and transmitted using a variety of media (e.g., computer readable media) in a number of manners. In some embodiments, hard-wired circuitry or custom hardware may be used in place of, or in combination with, software instructions for implementation of the processes of various embodiments. Thus, embodiments are not limited to any specific combination of hardware and software. Accordingly, a description of a process likewise describes at least one apparatus for performing the process, and likewise describes at least one computer-readable medium and/or memory for performing the process. The apparatus that performs the process can include components and devices (e.g., a processor, input and output devices) appropriate to perform the process. A computer-readable medium can store program elements appropriate to perform the method.

The present disclosure provides, to one of ordinary skill in the art, an enabling description of several embodiments and/or inventions. Some of these embodiments and/or inventions may not be claimed in the present application, but may nevertheless be claimed in one or more continuing applications that claim the benefit of priority of the present application. Applicant intends to file additional applications to pursue patents for subject matter that has been disclosed and enabled but not claimed in the present application. For example, in some embodiments, a compressible sub-pad can be used during CMP processing to insure the pad used for planarization is held flat against (e.g., parallel to) the major surface of the substrate during processing.

Accordingly, while the invention has been disclosed in connection with example embodiments thereof, it should be understood that other embodiments may fall within the scope of the invention, as defined by the following claims.

The invention claimed is:

1. A substrate pre-clean system comprising:
   a housing;
   a chuck assembly configured to securely hold a substrate within the housing; and
   a buffing pad assembly configured to rotate against the substrate and supported within the housing,
   wherein the buffing pad assembly includes:
      a buff pad,
      a compressible sub-pad coupled to the buff pad, and
      a pad holder coupled to the compressible sub-pad and a buffing motor configured to rotate the buffing pad assembly.

2. The substrate pre-clean system of claim 1 wherein the compressible sub-pad is greater than two times more compressible than the buff pad.

3. The substrate pre-clean system of claim 1 wherein the compressible sub-pad is adapted to yield when the pad holder tilts during pre-cleaning so that the buff pad remains flat against the substrate.

4. The substrate pre-clean system of claim 1 wherein the system is adapted to pre-clean substrates after chemical mechanical planarization processing and before application of a cleaning module.

5. The substrate pre-clean system of claim 1 wherein the buffing pad assembly further includes a stiffener layer between the buff pad and the compressible sub-pad.

6. The substrate pre-clean system of claim 1 wherein at least one of adhesive, thermal bonding, and mechanical fasteners is used to couple the buff pad and the compressible sub-pad together within the buffing pad assembly.

7. The substrate pre-clean system of claim 1 wherein the buffing pad assembly has a diameter that is smaller than the diameter of the substrate.

8. A pre-clean buffing pad assembly comprising:
a buff pad;
a compressible sub-pad coupled to the buff pad; and
a pad holder coupled to the compressible sub-pad and a buffing motor configured to rotate the buffing pad assembly against a substrate.

9. The pre-clean buffing pad assembly of claim 8 wherein the compressible sub-pad is greater than two times more compressible than the buff pad.

10. The pre-clean buffing pad assembly of claim 8 wherein the compressible sub-pad is adapted to yield when the pad holder tilts during pre-cleaning so that the buff pad remains flat against the substrate.

11. The pre-clean buffing pad assembly of claim 8 wherein the buffing pad assembly is adapted to be used to pre-clean substrates after chemical mechanical planarization processing and before application of a cleaning module.

12. The pre-clean buffing pad assembly of claim 8 wherein the buffing pad assembly further includes a stiffener layer between the buff pad and the compressible sub-pad.

13. The pre-clean buffing pad assembly of claim 8 wherein at least one of adhesive, thermal bonding, and mechanical fasteners is used to couple the buff pad and the compressible sub-pad together within the buffing pad assembly.

14. The pre-clean buffing pad assembly of claim 8 wherein the buffing pad assembly has a diameter that is smaller than the diameter of the substrate.

15. A method of pre-cleaning substrates in a substrate pre-clean module, comprising:
loading a substrate into a pre-clean system after chemical mechanical planarization processing;
securing the substrate to a chuck assembly;
rotating the substrate as a rotating buffing pad assembly is pressed against, rotated, and swept across the front side of the substrate; and
maintaining a buff pad of the buffing pad assembly flat against the substrate despite tilting of a pad holder of the buffing pad assembly.

16. The method of claim 15 further comprising providing a buffing pad assembly including a compressible sub-pad wherein the compressible sub-pad is greater than two times more compressible than the buff pad.

17. The method of claim 15 further comprising providing a buffing pad assembly including a compressible sub-pad wherein the compressible sub-pad is adapted to yield when the pad holder tilts during pre-cleaning so that the buff pad remains flat against the substrate.

18. The method of claim 15 further comprising providing a buffing pad assembly wherein the buffing pad assembly is adapted to pre-clean substrates after chemical mechanical planarization processing and before application of a cleaning module.

19. The method of claim 15 further comprising providing a buffing pad assembly including a compressible sub-pad and a stiffening layer wherein the stiffener layer is disposed between the buff pad and the compressible sub-pad.

20. The method of claim 15 further comprising providing a buffing pad assembly wherein the buffing pad assembly has a diameter that is smaller than the diameter of the substrate.

\* \* \* \* \*